Dec. 13, 1966 S. EVEN 3,291,974

PLANAR FUNCTION GENERATOR USING MODULO 2 UNPRIMED CANONICAL FORM LOGIC

Filed Dec. 14, 1964

INVENTOR.
SHIMON EVEN
BY
Robert J. Haase
ATTORNEY

United States Patent Office 3,291,974
Patented Dec. 13, 1966

3,291,974

PLANAR FUNCTION GENERATOR USING MODULO 2 UNPRIMED CANONICAL FORM LOGIC

Shimon Even, Haifa, Israel, assignor to Sperry Rand Corporation, Great Neck, N.Y., a corporation of Delaware Filed Dec. 14, 1964, Ser. No. 418,100
6 Claims. (Cl. 235—176)

The present invention generally relates to switching function generators and, more particularly, to a switching function generator especially adapted for planar microcircuit construction in which no crossover interconnections are required between the individual logic modules comprising the generator.

As is well known, a switching function generator is a digital device receiving a given number of input signals and producing in response thereto an output signal having a value which is some prescribed function of the values of the input signals. It is advantageous that the switching function generator be easily adapted to produce any one of the possible $2^{2^n}$ switching functions of the $n$ input variables without requiring any structural change in or between the logic modules comprising the generator. It is also advantageous that the design of the generator be compatible with microcircuit and monolithic microcircuit techniques so that the fabrication problems peculiar to the use of such modern techniques be kept to a minimum.

Perhaps the most serious problem confronting the designer of logical circuits utilizing microcircuit and monolithic microcircuit techniques is the problem of low yield. Generally, the more complicated the interconnections between the individual microcircuit logic modules and the more numerous the modules in a given logical circuit, the lower the probability that satisfactorily operable circuits will result from a given number of circuit fabrication attempts. To increase the yield of satisfactorily operable circuits, it is desirable that the number of logic modules for achieving a desired function be reduced to a minimum and that the interconnections between said modules be made as straight-forward and uncomplicated as possible.

It is the principal object of the present invention to provide a switching function generator characterized by a minimum number of individual logic modules and by straight-forward and simple interconnections between said modules.

Another object of the present invention is to provide a switching function generator especially suited for construction by microcircuit and monolithic microcircuit techniques.

These and other objects of the present invention as will appear from a reading of the following specification, are achieved by the provision of a switching function generator comprising two special types of logic modules which are connected together without external crossovers, i.e., without requiring that any one connector between the modules cross the path of any other connector between the modules. The individual logic modules preferably are constructed through the use of microcircuit techniques in which individual chips of semiconductor material are fixed to a dielectric substrate and hand-wired to each other, or are interconnected to each other by conductive material deposited directly on the substrate with insulating material separating the conductors at the point where they cross each other. Alternatively, each individual module may be a completely monolithic microcircuit device. One of the two types of logic modules, hereinafter termed type A, consists of an AND gate and a crossover.

The other type of logic module, hereinafter termed type B, consists of an AND gate, a modulo 2 adder and a crossover. Each type A module receives two input signals and provides two output signals identical thereto and a third output signal which is the conjunction of both input signals. Each type B module receives three input signals and provides one output signal which is the modulo 2 sum of one of the input signals and the conjunction of both input signals. Although each logic module requires the use of one crossover within itself, no crossovers are required when connecting the logic modules to each other so as to form the desired function generator. Consequently, the entire network of connectors external to the logic modules for connecting the modules to each other conveniently may take the form of a printed circuit wherein no conductor traverses the path of any other conductor.

The logic modules are arranged in a "tree" array of $n$ rows of type A modules and 1 row of type B modules. The first row consists of only one module of type A. The second row of the "tree" consists of 2 modules of type A; the $i$th row contains $2^{i-1}$ modules of type A, and the $n$th row contains $2^{n-1}$ modules of type A. The $(n+1)$st row of modules consist of $2^n$ modules of type B. Thus, there are a total of $2^n-1$ modules of type A and $2^n$ modules of type B in the switching function generator. Each input signal which represents a given input variable is applied to a respective type A module row of the "tree," and flows unchanged from the input to one output of each module in its path along the row. Each of the other two outputs from a type A module of a preceding row is connected to an input of a respective type A module of a succeeding row. The single type A module of the first row also receives an input signal representing the binary value unity. One output signal from each module in the last type A module row of the "tree" is applied to a respective type B module in the final row of the "tree." In addition, each type B module receives a respective binary-valued input signal representing the value of the coefficient of a respective term of the desired switching function expressed in modulo 2 unprimed canonical form. The output of a preceding type B module is connected to the third input of a succeeding type B module. The first type B module receives at its third input an input signal representing the binary value zero. An output signal representing the value of the desired switching function is produced at the output of the last type B module. The switching function may be readily changed to any one of the possible $2^{2^n}$ switching functions of the $n$ input variables simply by changing the binary-valued coefficient signals applied to the type B modules.

For a more complete understanding of the present invention, reference should be had to the following specification and to the appended figures of which:

The switching function generator of the present invention may be constructed for any number $n$ of input variables. Once the generator is constructed for a specific $n$, the generator will produce any one of the $2^{2^n}$ switching functions of the $n$ variables. In the illustrative embodiment of FIGURE 1, the number of input variables are 3.

Figure 2:
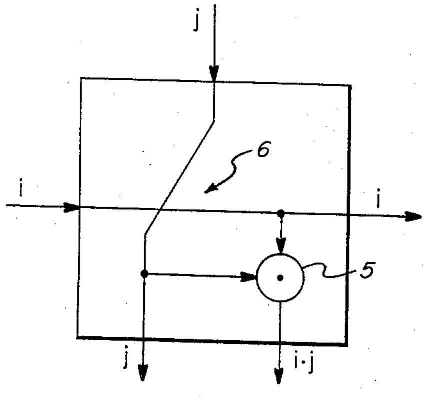
FIGURE 2 is a simplified functional diagram of one of the logic modules comprising the function generator of FIGURE 1.

Correspondingly, the generator will produce any desired one of the 256 switching functions. The generator consists of a plurality of two types of logic modules interconnected to each other in a "tree" configuration. The first row of the "tree" consists only of type A module 2 which receives an input signal representing the input variable $x$ on line 3 and an input signal representing the binary value unity on line 4. Referring to the simplified logic diagram of FIGURE 2, it will be seen that each type A module consists of an AND gate 5 and a crossover 6. The type A module receives two input signals represented by the symbols $i$ and $j$. The signal represented by $i$ passes through the module without change; it is also applied to one input of AND gate 5. The other signal $j$ also passes through the module unchanged and is applied to the second input of AND gate 5. Consequently, the type A module receives two input signals $i$ and $j$ and provides the two output signals $i$ and $j$ as well as the conjunction $i \cdot j$.

The second row of the "tree" consists of type A modules 7 and 8. Module 7 receives an input signal representing the input variable $y$. The signal representing $y$ passes unchanged through module 7 and through module 8 via the respective crossovers. It will be noted, however, that the signal representing $y$ also is applied to an AND gate corresponding to gate 5 within each of modules 7 and 8. Module 7 receives the crossover output from module 2 having the binary value unity whereas module 8 receives the conjunction output from module 2 resulting from "ANDING" the two inputs applied to module 2. Consequently, module 7 receives input signals representing unity and the input variable $y$ and produces in response thereto three output signals representing unity, the variable $y$ on output line 13 and the variable $y$ on output line 14. In analogous fashion module 8 receives two input signals representing the variables $x$ and $y$ and produces in response thereto three output signals representing the variable $x$, the conjunction $xy$ (resulting from the "ANDING" of the variables $x$ and $y$ in the AND gate of module 8) and the variable $y$. The input signals applied to each of the type A modules and the output signals provided by each of the type A modules are indicated adjacent the respective lines in FIGURE 1.

Figure 3:
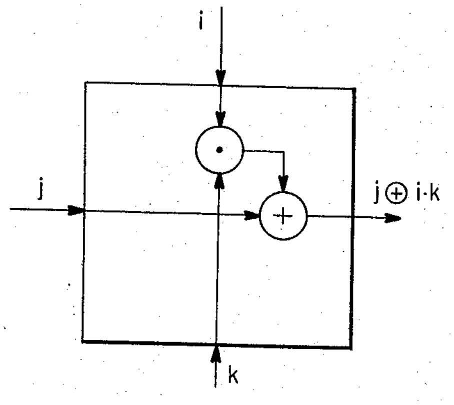
FIGURE 3 is a simplified functional diagram of the other logic module comprising the function generator of FIGURE 1.

The output signals from the last type A row of the "tree" are applied to respective type B modules 15–22, inclusive. Each of the type B modules also receives an input signal representing the coefficient of the respective term of the desired switching function expressed in modulo 2 unprimed canonical form. Modulo 2 unprimed canonical form logic is discussed in the paper by Dr. Martin Cohn "Canonical Forms of Functions in P-Valued Logics," AIEE Proceedings of the Second Annual Symposium on Switching Circuit Theory and Logical Design, October 1961. The manner in which the values of the coefficients are established will be described later. Additionally, module 15 receives an input signal on line 23 representing the binary value zero. Assuming, for example, that the value of the coefficient $C_0$ is unity as represented by the signal on line 24, it will be seen by reference to FIGURE 3 that module 15 provides an output signal on line 25 having the value of unity. Similarly, assuming that the coefficient $C_1$ also is unity, module 16 produces an output signal on line 26 having the value $1+z$ and so on.

Figure 1:
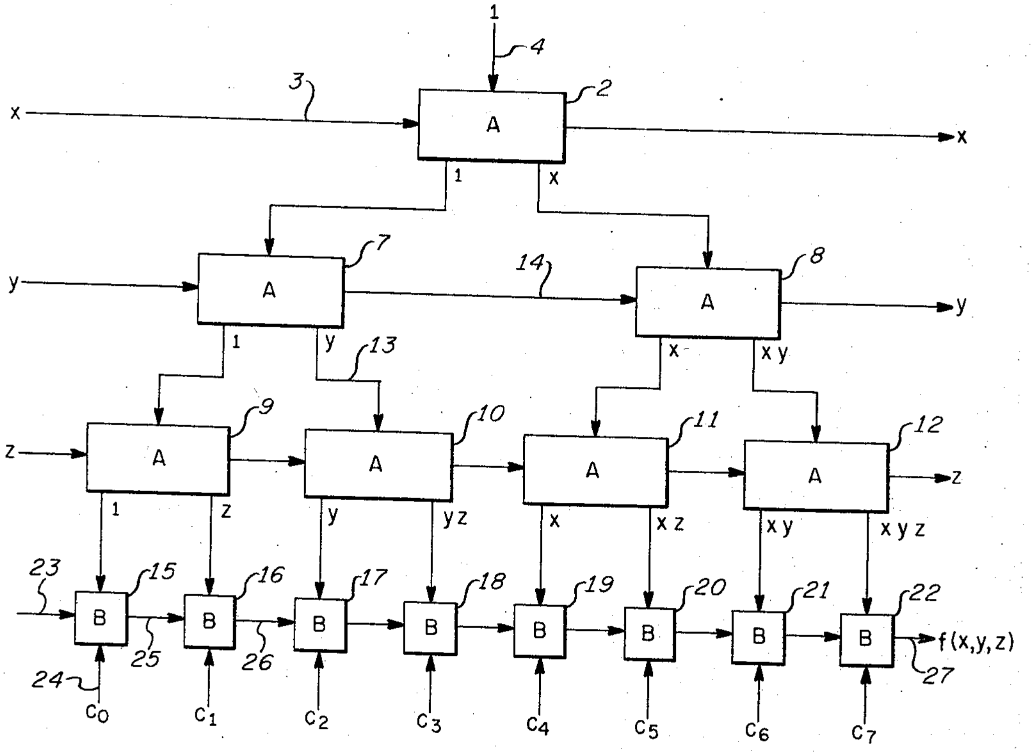
FIGURE 1 is a simplified block diagram of a typical embodiment of the invention for receiving signals representing three input variables.

The operation of the function generator of FIGURE 1 and the manner in which the coefficient signals applied to the type B modules are established can be disclosed best by way of example. Let it be assumed that the switching function equivalent to the Boolean expression $$f(x,y,z,)=xz+\bar{x}(\bar{y}+\bar{z})$$

is to be generated by the embodiment of FIGURE 1. In order to establish the values for the coefficient signals to be applied to the type B modules 15–22, inclusive, it is convenient first to evaluate the desired switching function assumed above for each of the possible values of the three input variables. The following Truth Table represents the value of the desired switching function for each of the 8 possible combinations of the three input variables:

| $x$ | $y$ | $z$ | $f$ |
|---|---|---|---|
| 0 | 0 | 0 | 1 |
| 0 | 0 | 1 | 1 |
| 0 | 1 | 0 | 1 |
| 0 | 1 | 1 | 0 |
| 1 | 0 | 0 | 0 |
| 1 | 0 | 1 | 1 |
| 1 | 1 | 0 | 0 |
| 1 | 1 | 1 | 1 |

The required values for the coefficient signals can be obtained by multiplying the right-hand column ($f$) of numbers of the Truth Table, representing the values of the given switching function for all values of $x$, $y$ and $z$, by a special matrix consisting of 8 rows and 8 columns of binary numbers. The matrix is a composite resulting from operations upon the basic matrix element $$\begin{matrix} 1 & 0 \\ 1 & 1 \end{matrix}$$

If only two input variables were involved, the required four-by-four multiplying matrix is synthesized by replacing each 1 in the basic matrix by the entire matrix and by replacing the 0 by a matrix of zeros as follows:

$$\begin{matrix} 1 & 0 & 0 & 0 \\ 1 & 1 & 0 & 0 \\ 1 & 0 & 1 & 0 \\ 1 & 1 & 1 & 1 \end{matrix}$$

In the assumed case of three input variables $x$, $y$ and $z$, the required eight-by-eight matrix is $$\begin{matrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{matrix}$$

The manner in which any desired enlarged multiplying matrix is synthesized from the basic matrix element $$\begin{matrix} 1 & 0 \\ 1 & 1 \end{matrix}$$

for any given number of input variables is self-evident from the foregoing examples.

There results from multiplying the 8 x 8 matrix with the right-hand column ($f$) of the Truth Table the series of numbers 1, 0, 0, 1, 1, 1, 0, 1 as shown below:

Matrix Multiplier $f$ $c$ $$\begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \begin{bmatrix} 1 \\ 1 \\ 1 \\ 0 \\ 0 \\ 1 \\ 0 \\ 1 \end{bmatrix} = \begin{matrix} 1 \\ 0 \\ 0 \\ 1 \\ 1 \\ 1 \\ 0 \\ 1 \end{matrix}$$

The series of numbers, reading from top to bottom, represent the individual co-efficients $C_0$–$C_7$ to be applied to the type B modules of FIGURE 1. Thus, the function generator of FIGURE 1 produces an output signal on line 27 representing the desired switching function in its modulo 2 unprimed canonical form $f=1\oplus yz\oplus x\oplus xz\oplus xyz$ resulting from the application of the coefficient ($c$) signals to modules 15, 18, 19, 20 and 22 having the value unity and the application of co-efficient ($c$) signals to modules 16, 17 and 21 having the value zero.

It will be observed that when the modulo 2 expression $f=1\oplus yz\oplus x\oplus xz\oplus xyz$ is evaluated for all values of $x$, $y$ and $z$, the results are completely identical to those set forth in the foregoing Truth Table evaluation of the equivalent Boolean expression $xz+\bar{x}(\bar{y}+\bar{z})$. Although said results are identical, only the instrumentation of the present invention can be realized without requiring crossover interconnections between the modules and without any off-setting significant increase in module complexity or quantity.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A logical network comprising $n$ rows of first logic modules and one row of second logic modules connected in tree configuration, each said first module receiving first and second input signals at first and second input terminals and providing first and second output signals identical thereto and a third output signal which is the conjunction of said first and second input signals, each said second module receiving third, fourth and fifth input signals at third, fourth and fifth input terminals and providing one output signal which is the modulo 2 sum of said third input signal and the conjunction of said fourth and fifth input signals, the first output signal from each first module of a preceding row being applied to the second input terminal of a respective first module of a succeeding row, the third output signal from said first module of a preceding row being applied to the second input terminal of a different respective first module of said succeeding row, the first output signal from each first module of the last row of first modules being applied to the fourth input terminal of a respective second module, the third output signal from each said first module of said last row of first modules being applied to the fourth input terminal of a different respective second module, the output signal from a preceding second module being applied to the third input terminal of a succeeding second module.

2. A logical network as defined in claim 1 wherein each of said first modules comprises a first AND gate and a first crossover, said first and second input signals being applied to said first AND gate and to said first crossover, and each of said second modules comprises a second AND gate, a modulo 2 adder and a second crossover, said fourth and said fifth input signals being applied to said second AND gate, said third input signal and the conjunction of said fourth and fifth signals being applied to said modulo 2 adder.

3. A logical network as defined in claim 1 wherein said $n$ rows of first logic modules total $2^n-1$ in number and said one row of second logic modules totals $2^n$ in number, the $n$th row of said tree configuration consisting of $2^{n-1}$ first modules, and the last row of said tree configuration consisting of all of said second modules.

4. A function generator for producing any of the $2^{2^n}$ functions of $n$ variables represented by $n$ input signals, said generator comprising, $n$ rows of first logic modules and one row of second logic modules connected in tree configuration, each said first module receiving first and second input signals at first and second input terminals and providing first and second output signals identical thereto and a third output signal which is the conjunction of said first and second input signals, each said second module receiving third, fourth, and fifth input signals at third, fourth and fifth input terminals and providing one output signal which is the modulo 2 sum of said third input signal and the conjunction of said fourth and fifth input signals, the first output signal from each first module of a preceding row being applied to the second input terminal of a respective first module of a succeeding row, the third output signal from said first module of a preceding row being applied to the second input terminal of a different respective first module of said succeeding row, the first output signal from each first module of the last row of first modules being applied to the fourth input terminal of a respective second module, the third output signal from each said first module of said last row of first modules being applied to the fourth input terminal of a different respective second module, the output signal from a preceding second module being applied to the third input terminal of a succeeding second module, a signal representing the binary value one being applied to the second input terminal of the module in the first row of first modules, a signal representing the binary value zero being applied to the third input terminal of the first one of said second modules, each of said $n$ input signals representing said $n$ variables being applied to the first input terminals of each first module in a respective row, and signals representing the coefficients of a desired function expressed in modulo 2 unprimed canonical form being applied to the fifth inputs of respective second modules, the output signal produced by the last one of said second modules representing the desired function.

5. A function generator as defined in claim 4 wherein each of said first modules comprises a first AND gate and a first crossover said first and second input signals being applied to said first AND gate and to said first crossover, and each of said second modules comprises a second AND gate, a modulo 2 adder and a second crossover, said fourth and fifth input signals being applied to said second AND gate, said third input signal and the conjunction of said fourth and fifth signals being applied to said modulo 2 adder.

6. A function generator as defined in claim 4 wherein said $n$ rows of first logic modules total $2^n-1$ in number and said one row of second logic modules totals $2^n$ in number, the $n$th row of said tree configuration consisting of $2^{n-1}$ first modules, and the last row of said tree configuration consisting of all of said second modules.

No references cited.

MALCOLM A. MORRISON, *Primary Examiner.*

M. J. SPIVAK, *Assistant Examiner.*